(12) United States Patent
Chen

(10) Patent No.: US 10,433,430 B2
(45) Date of Patent: Oct. 1, 2019

(54) MEMORY MODULE CARD STRUCTURE

(71) Applicant: Sung-Yu Chen, Hsinchu (TW)

(72) Inventor: Sung-Yu Chen, Hsinchu (TW)

( * ) Notice: Subject to any disclaimer, the term of this patent is extended or adjusted under 35 U.S.C. 154(b) by 0 days.

(21) Appl. No.: 16/194,526

(22) Filed: Nov. 19, 2018

(65) Prior Publication Data

US 2019/0191570 A1 Jun. 20, 2019

Related U.S. Application Data

(60) Provisional application No. 62/599,800, filed on Dec. 18, 2017.

(51) Int. Cl.
| | |
|---|---|
| *H05K 1/00* | (2006.01) |
| *H05K 3/34* | (2006.01) |
| *H01L 23/00* | (2006.01) |
| *G11C 5/06* | (2006.01) |
| *G11C 11/407* | (2006.01) |

(52) U.S. Cl.
CPC ............. *H05K 3/34* (2013.01); *G11C 5/06* (2013.01); *G11C 11/407* (2013.01); *H01L 24/26* (2013.01)

(58) Field of Classification Search
CPC ......... G11C 5/06; G11C 11/407; H01L 24/26; H05K 3/34
USPC ........................................................ 439/83
See application file for complete search history.

(56) References Cited

U.S. PATENT DOCUMENTS

| | | | | |
|---|---|---|---|---|
| 5,394,609 A | * | 3/1995 | Ferguson ............ | H01R 43/205 29/840 |
| 5,502,892 A | * | 4/1996 | Lien .................... | H05K 5/0269 174/520 |
| 5,548,483 A | * | 8/1996 | Feldman ............. | G06K 19/077 361/737 |
| 5,846,092 A | * | 12/1998 | Feldman ............. | G06K 19/077 439/76.1 |
| 5,955,021 A | * | 9/1999 | Tiffany, III ....... | B29C 45/14647 264/272.11 |
| 6,025,054 A | * | 2/2000 | Tiffany, III ............ | G06K 19/02 235/487 |
| 6,128,195 A | * | 10/2000 | Weber .................... | H05K 3/284 257/679 |
| 6,241,153 B1 | * | 6/2001 | Tiffany, III ....... | B29C 45/14647 235/488 |

(Continued)

*Primary Examiner* — Tho D Ta
*Assistant Examiner* — Vladimir Imas
(74) *Attorney, Agent, or Firm* — Li & Cai Intellectual Property (USA) Office

(57) ABSTRACT

A memory module card structure includes a main board, a plurality of adhesive layers and a plurality of conduction skirting boards. Two surfaces of the main board respectively are divided into a mounting section and an inserting section. The inserting section is formed with a binding region, and a soldering region having solder pads electrically connected to the mounting section. The conduction skirting boards are correspondingly fixed to the inserting section, and each has a rigid substrate and a plurality of conductive pads. The conductive pad has an outer contacting part disposed on an outer surface of the rigid substrate and an adapting part formed through the rigid substrate and connecting the outer contacting part. A part of the conductive pad correspondingly is soldered to the solder pad. A part of the rigid substrate is fixed connected to the binding region by the adhesive layer.

10 Claims, 8 Drawing Sheets

(56) References Cited

U.S. PATENT DOCUMENTS

| | | | | |
|---|---|---|---|---|
| 6,256,873 B1* | 7/2001 | Tiffany, III | B29C 45/14647 | 174/565 |
| 6,370,028 B1* | 4/2002 | Seeley | H05K 5/0269 | 211/41.17 |
| 6,396,702 B1* | 5/2002 | Boucheron | B60R 16/02 | 361/752 |
| 6,670,697 B2* | 12/2003 | Hasegawa | H05K 3/0052 | 257/670 |
| 6,719,570 B2* | 4/2004 | Tsuchioka | G06K 19/077 | 235/492 |
| 6,855,891 B2* | 2/2005 | Eguchi | H05K 1/117 | 174/250 |
| 6,945,466 B2* | 9/2005 | Sanemitsu | G06K 19/07745 | 235/375 |
| 6,947,288 B2* | 9/2005 | Simmons | H05K 5/0273 | 174/368 |
| 6,960,923 B2* | 11/2005 | Eldridge | G01R 31/2851 | 324/756.03 |
| 7,104,804 B2* | 9/2006 | Batinovich | H01L 21/4853 | 257/E21.508 |
| 7,259,967 B2* | 8/2007 | Ni | H01R 13/502 | 361/737 |
| 7,359,208 B2* | 4/2008 | Ni | G11B 33/12 | 174/50.51 |
| 7,407,390 B1* | 8/2008 | Ni | G06K 19/07732 | 361/752 |
| 7,864,540 B2* | 1/2011 | Takiar | G06K 19/04 | 361/736 |
| 8,488,332 B2* | 7/2013 | Eguchi | H05K 1/117 | 361/748 |
| 8,631,900 B2* | 1/2014 | Miyake | E04F 15/20 | 181/290 |
| 8,998,620 B2* | 4/2015 | Ni | H01R 12/71 | 361/737 |
| 9,278,510 B2* | 3/2016 | Segura | B32B 37/206 | |
| 2005/0013106 A1* | 1/2005 | Takiar | G06K 19/077 | 361/679.31 |
| 2007/0128891 A1* | 6/2007 | Ling | H05K 1/117 | 439/55 |

* cited by examiner

MEMORY MODULE CARD STRUCTURE

CROSS-REFERENCE TO RELATED PATENT APPLICATION

This application claims priority from the U.S. Provisional Patent Application Ser. No. 62/599,800 filed Dec. 18, 2017, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a memory module card structure, and more particularly to a memory module card plugged in a computer for accessing data.

BACKGROUND OF THE DISCLOSURE

Most memory module cards of a computer are Double Data Rate Synchronous Dynamic Random Access Memories (DDR SDRAM), which is an SDRAM with double data transmission rates. The data transmission rate is twice as fast as system time-pulse, different than SDR (Single Data Rate) which merely read/write once in a single period. The "Double" in DDR means that data is read/write twice in a single period. When the core clock rate remains the same, the transmission efficiency is double that of the SDR SDRAM.

Since the transmitting speed of memory module card is getting faster and faster, the demand for dissipating heat is getting bigger and bigger. However, the intervals between the memory module cards are unavoidably limited by the memory module card connectors mounted in a computer host, and are hard to change, which results in the worse efficiency of the heat dissipation of memory module card.

SUMMARY OF THE DISCLOSURE

In response to the above-referenced technical inadequacies, the present disclosure provides a memory module card structure which can reduce the total thickness, so that the interval of adjacent two of the memory module cards can be enlarged, and the efficiency of the heat dissipation of memory module card can be enhanced.

In one aspect, the present disclosure provides a memory module card structure including a main board, at least one adhesive layer, and at least one conduction skirting board. The main board has a first surface and a second surface. The main board is divided into a mounting section and an inserting section along an inserting direction. The inserting sections of the first surface and the second surface respectively have a binding region and a soldering region. The soldering region has a plurality of solder pads. The solder pads are electrically connected to the mounting section. The at least one adhesive layer disposed on the binding region of the inserting section. The at least one conduction skirting board is correspondingly fixed to the inserting section. Each of the at least one conduction skirting board has a rigid substrate and a plurality of conductive pads. Each of the conductive pads has an outer contacting part and an adapting part. The outer contacting part is located an outer surface of the rigid substrate. The adapting part passes through an outer surface and an inner surface of the rigid substrate, and connects the outer contacting part. A part of the conductive pads is correspondingly electrically connected to the solder pads, and a part of the rigid substrate is fixedly connected to the binding region of the inserting section by the adhesive layer.

Therefore, the instant disclosure has advantages as follows. The memory module card structure of the present disclosure has the conduction skirting board having conductive pads formed thereon, which can reduce the thickness of the main board. Therefore, the total thickness of the memory module card structure of the present disclosure can be reduced. Accordingly, adjacent two of the memory module card structures are able to provide a larger gap for dissipating redundant heat, which benefits the high-frequency signals transmission.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
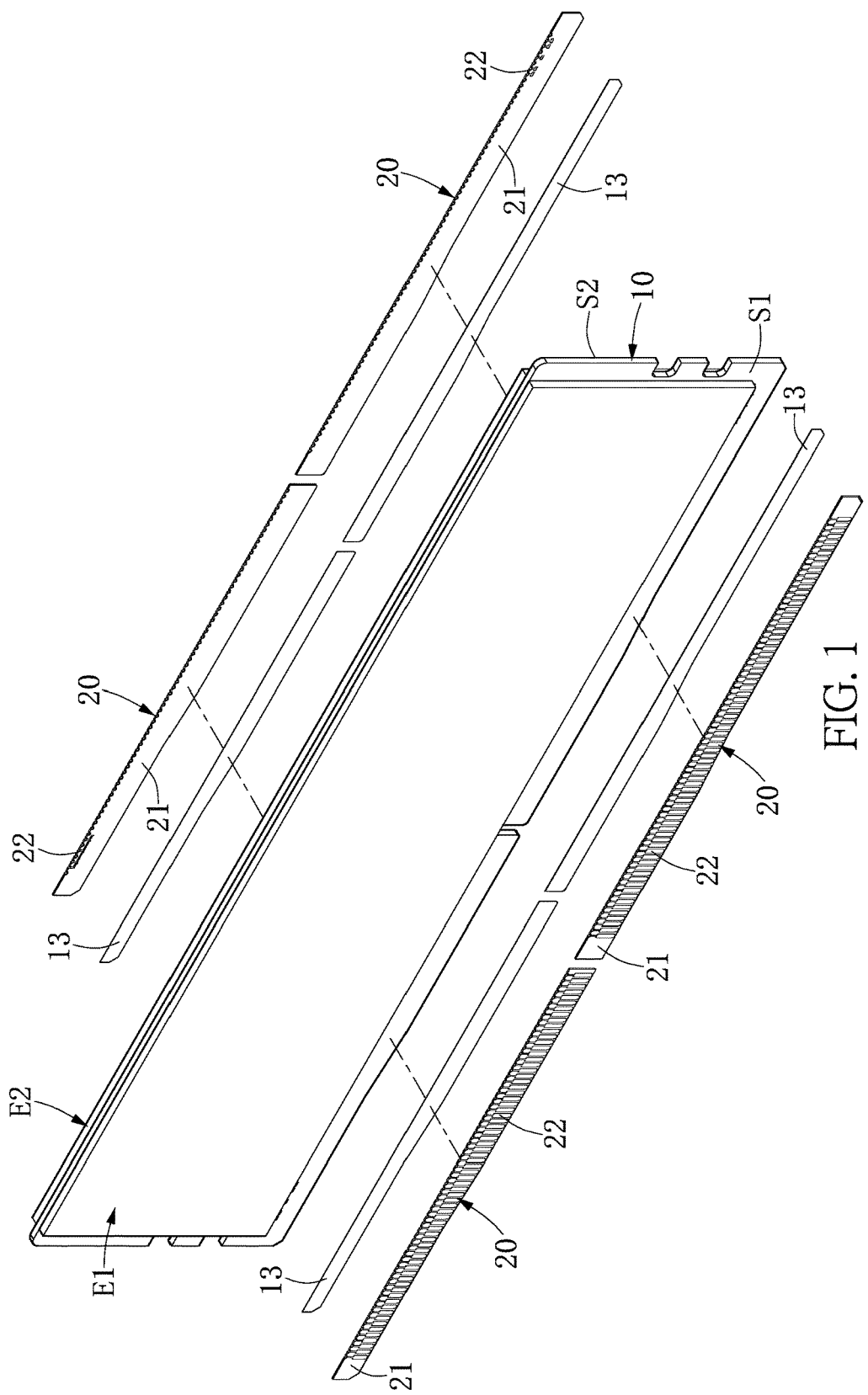
FIG. 1 is an exploded view of a memory module card structure of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1 to FIG. 4. The present disclosure provides a memory module card structure, or an electronic module card structure, which includes a main board 10, a plurality of adhesive layers 13 and a plurality of conduction skirting boards 20. The number of the adhesive layers 13 corresponds to the number of the conduction skirting boards 20. The conduction skirting boards 20 are fixed to and electrically connected to the main board 10 by the adhesive layer 13.

Figure 2:
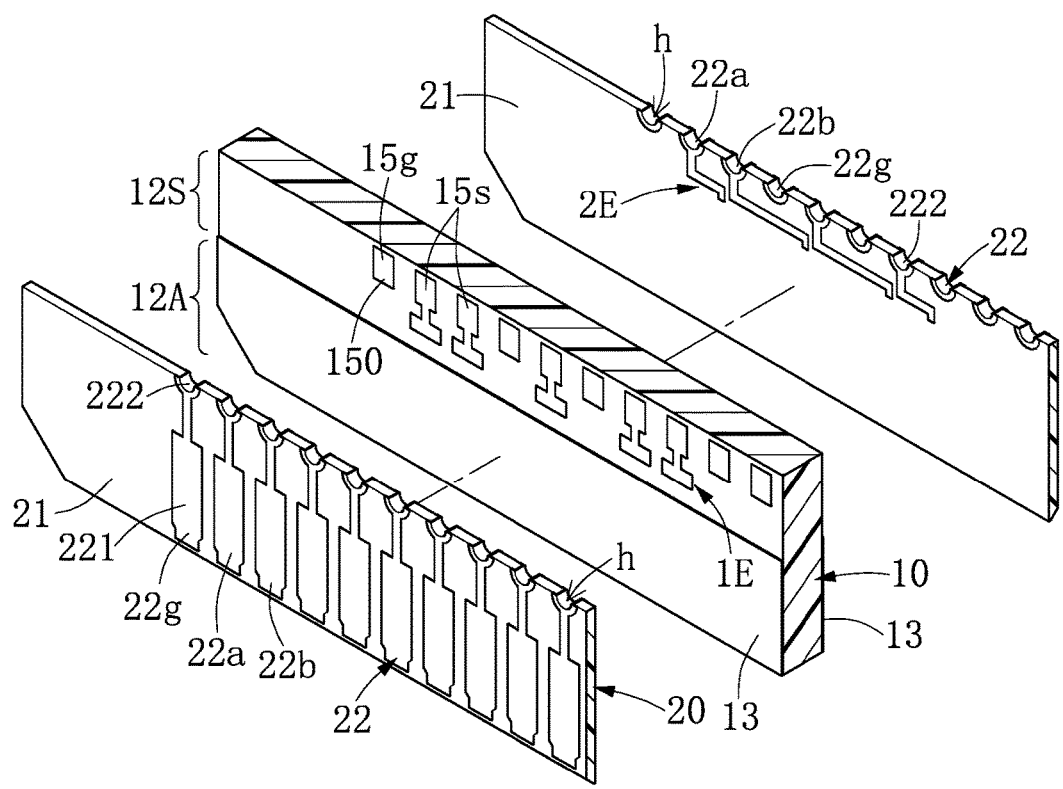
FIG. 2 is a partially-enlarged exploded view of the memory module card structure of the present disclosure.
Figure 2A:
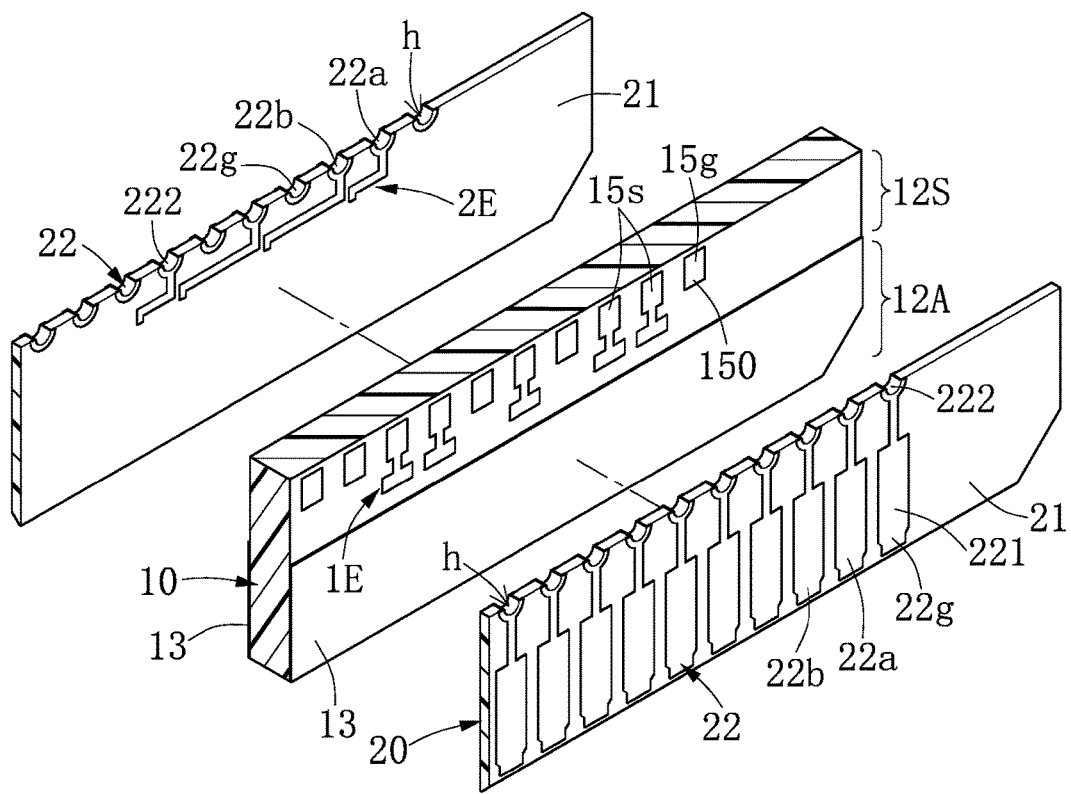
FIG. 2A is another partially-enlarged view of the memory module card structure of the present disclosure.

The main board 10 has a first surface S1 and a second surface S2 opposite to the first surface S1. The first surface S1 and the second surface S2 are respectively divided into a mounting section 11 and an inserting section 12. The mounting section 11 of the memory module card structure is provided for receiving semiconductor elements mounted thereon. The inserting section 12 is inserted in an electrical connector (not shown). In details, the first surface S1 of the memory module card structure has a first component layer E1 on the mounting section 11, and the second surface S2 has a second component layer E2 on the mounting section 11, which can receive a plurality of elements, respectively, such as memory chips. The first surface S1 and the second surface S2 respectively an inserting section 12. As shown in FIG. 2 and FIG. 2A, each of the inserting sections 12 is divided into a binding region 12A and a soldering region 12S. The soldering region 12S is close to the mounting section 11. The binding region 12A is close to an edge of the memory module card structure, in other words, close to an inserting end of the memory module card structure. The soldering region 12S has a plurality of solder pads 150 which are electrically connected to the mounting section 11. In details, the solder pads 150 are electrically connected to electronic elements on the mounting section 11 by via (or VIA, also known as vertical interconnect access), buried vias, or blind vias of the multilayer printed circuit board technology.

As shown in FIG. 1, this embodiment has four adhesive layers 13, but the present disclosure is not limited thereto, and the number can be at least one. The adhesive layer 13 is disposed on the binding region 12A of the inserting section 12, and used to fix the conduction skirting board 20 on the main board 10. The adhesive layer 13 can be made of insulated material, such as hot-melted adhesive.

As shown in FIG. 1, this embodiment has four conduction skirting boards 20, but the present disclosure is not limited thereto, and the number can be at least one. The conduction skirting boards 20 are correspondingly attached to the inserting sections 12. Each conduction skirting board 20 has a rigid substrate 21 and a plurality of conductive pads 22. The rigid substrate 21 is made of rigid board, such as glass fiber. Each conductive pad 22 has an outer contacting part 221, and an adapting part 222. The outer contacting parts 221 are formed on an outer surface of the rigid substrate 21 along the inserting direction, which are commonly referred to "gold finger". The adapting part 222 is connected to the outer contacting part 221. The adapting part 222 in this embodiment is semi-cylindrical-shaped, which has a part shaped in semi-annular extending to an outer surface of the rigid substrate 21, and another part shaped in semi-annular extending to an inner surface of the rigid substrate 21.

The method of manufacturing the conduction skirting board 20 can use the available method of manufacturing a conventional rigid PCB, which etches a copper clad laminate. The number of the conductive pads 22 of the conduction skirting board 20 is matched with that of the solder pads 150 of the main board 10.

Figure 3:
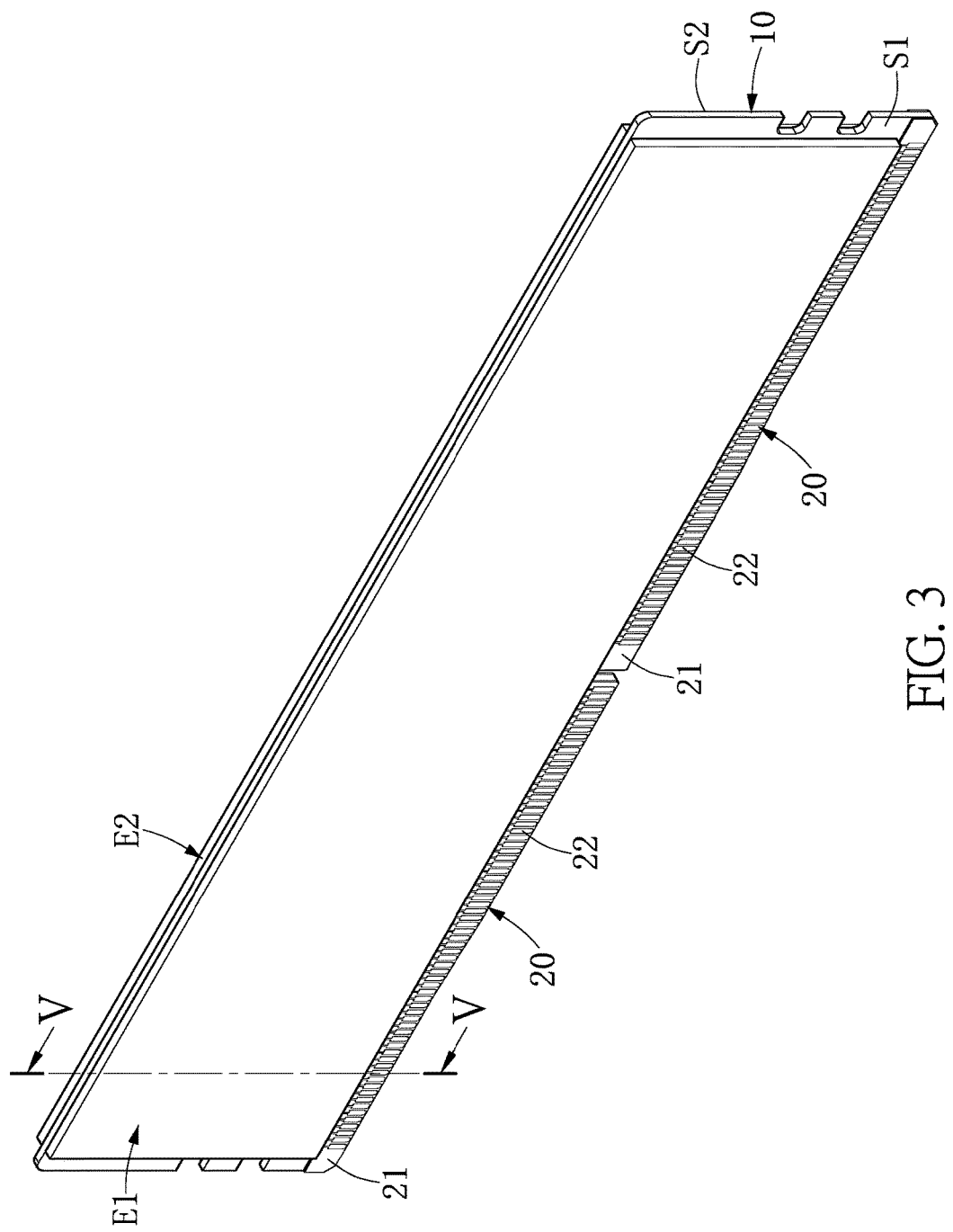
FIG. 3 is an assembled perspective view of the memory module card structure of the present disclosure.
Figure 4:
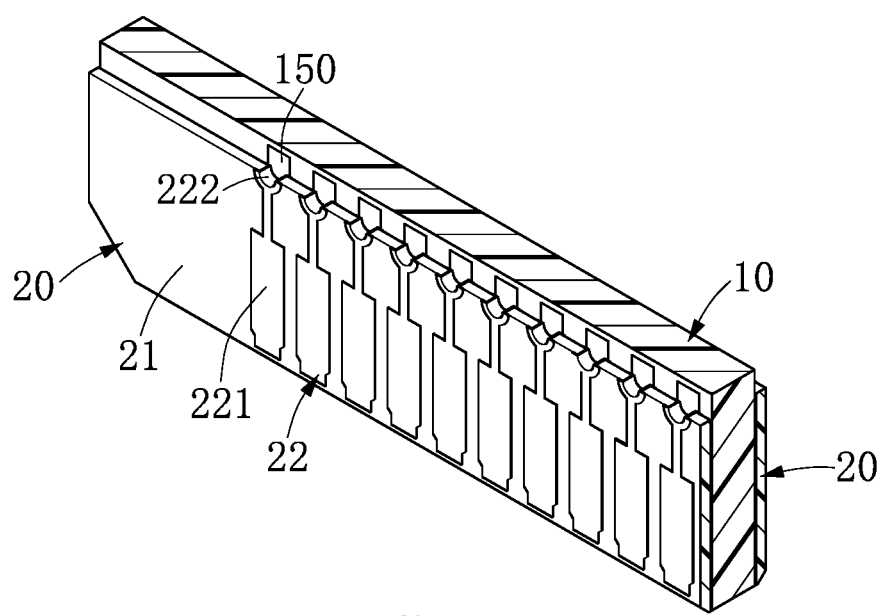
FIG. 4 is a partially-enlarged assembled perspective view of the memory module card structure of the present disclosure.

Reference is made to FIG. 3 and FIG. 4. The combining process of this embodiment is described in detail as an example as follows. A part of the adapting part 222 is correspondingly soldered to the solder pad 150, and a part of the rigid substrate 21 is fixed to the binding region 12A of the inserting section 12 by the adhesive layer 13. In other words, the conduction skirting board 20 has a part electrically connected the main board 10, and another part fixedly adhered to the main board 10. For example, the adhesive layer 13 can be sprayed on the main board 10, and the solder pads 150 of the main board 10 are sprayed with solder. Then, the conduction skirting board 20 is disposed on the inserting section 12 of the main board 10. Finally, the adapting parts 222 and the solder pads 150 are soldered together by a heating manner, such as by a hot press jig.

As shown in FIG. 4, the adapting parts 222 of the conductive pad 22 can be made by the VIA (vertical interconnect access) technology. The rigid substrate 21 is formed with a plurality of through holes h which pass through an inner surface and an outer surface of the rigid substrate 21. The adapting parts 222 can be formed on the periphery of the through hole h by an electroplating process.

Reference is made to FIG. 2 and FIG. 2A. In this embodiment, the conductive pad 22 of the memory module card structure is a general term of conductive pad electrically connected with the main board 10. The conductive pad 22 further includes grounded conductive pads 22$g$, or signal-transmitting conductive pads 22$a$, 22$b$. Each of the signal-transmitting conductive pads 22$a$, 22$b$ has a second extending part 2E. Taking the signal-transmitting conductive pad 22$a$ as an example, the second extending part 2E is substantially L-shaped, which first extends along a direction perpendicular to the outer contacting part 221, and then extends transversely to an adjacent to an adjacent one of the signal-transmitting conductive pads 22$b$ which has the second extending part. The grounded conductive pads 22$g$ have no any extending part. In this embodiment, the second extending part 2E of the signal-transmitting conductive pad 22$b$ extends across an adjacent one of the conductive pads 22$g$ (that is grounded type, without second extending part), and close to another one of the signal-transmitting conductive pads 22$b$ with the second extending part, but is not contacted with another one of the signal-transmitting conductive pads 22$b$.

Reference is made to FIG. 2A. To correspond with different types of the conductive pads 22$g$, 22$a$, 22$b$, the solder pads on the main board 10, which are electrically connected to the conduction skirting board 20, can be divided into grounded-type pad structures 15$g$ or signal-transmitting pad structures 15s. The pad structure 15s for transmitting signals has a first extending part 1E extending from the solder pad 150. In this embodiment, the first extending part 1E is substantially in the shape of an inverted-T. When the conduction skirting board 20 is attached to the main board 10, a part of the first extending part 1E is overlapped above a part of the second extending part 2E. A supplementary note is that, the above shapes of the first extending part 1E and the second extending part 2E are just one practical embodiment, but the present disclosure is not limited thereto. For example, the second extending part 2E can be substantially in the shape of an inverted-T, first extending part 1E can be substantially in L-shaped.

Figure 5:
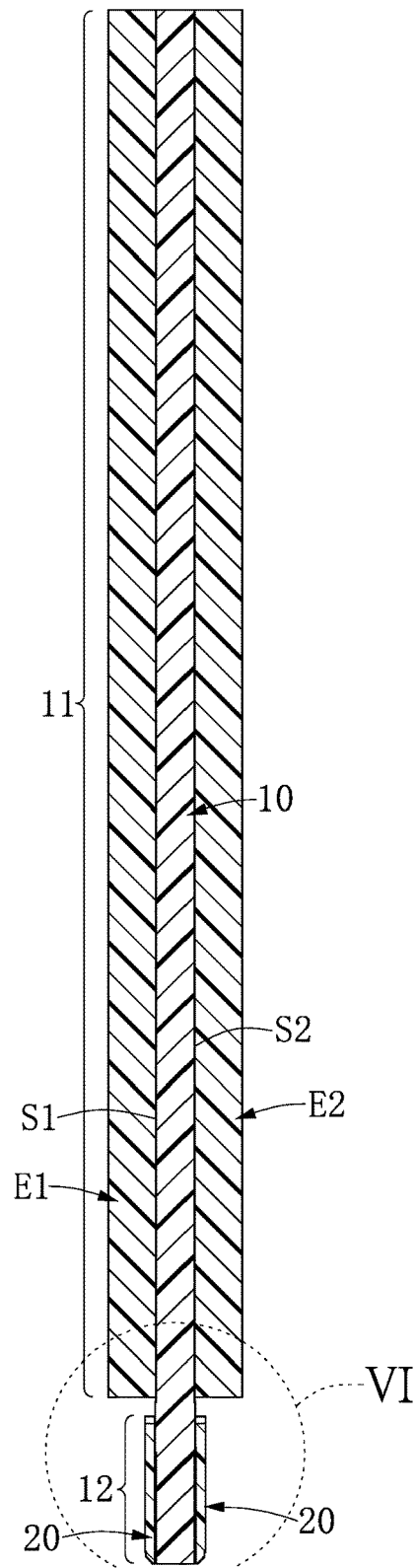
FIG. 5 is a cross-sectional view of the memory module card structure of the present disclosure.
Figure 6:
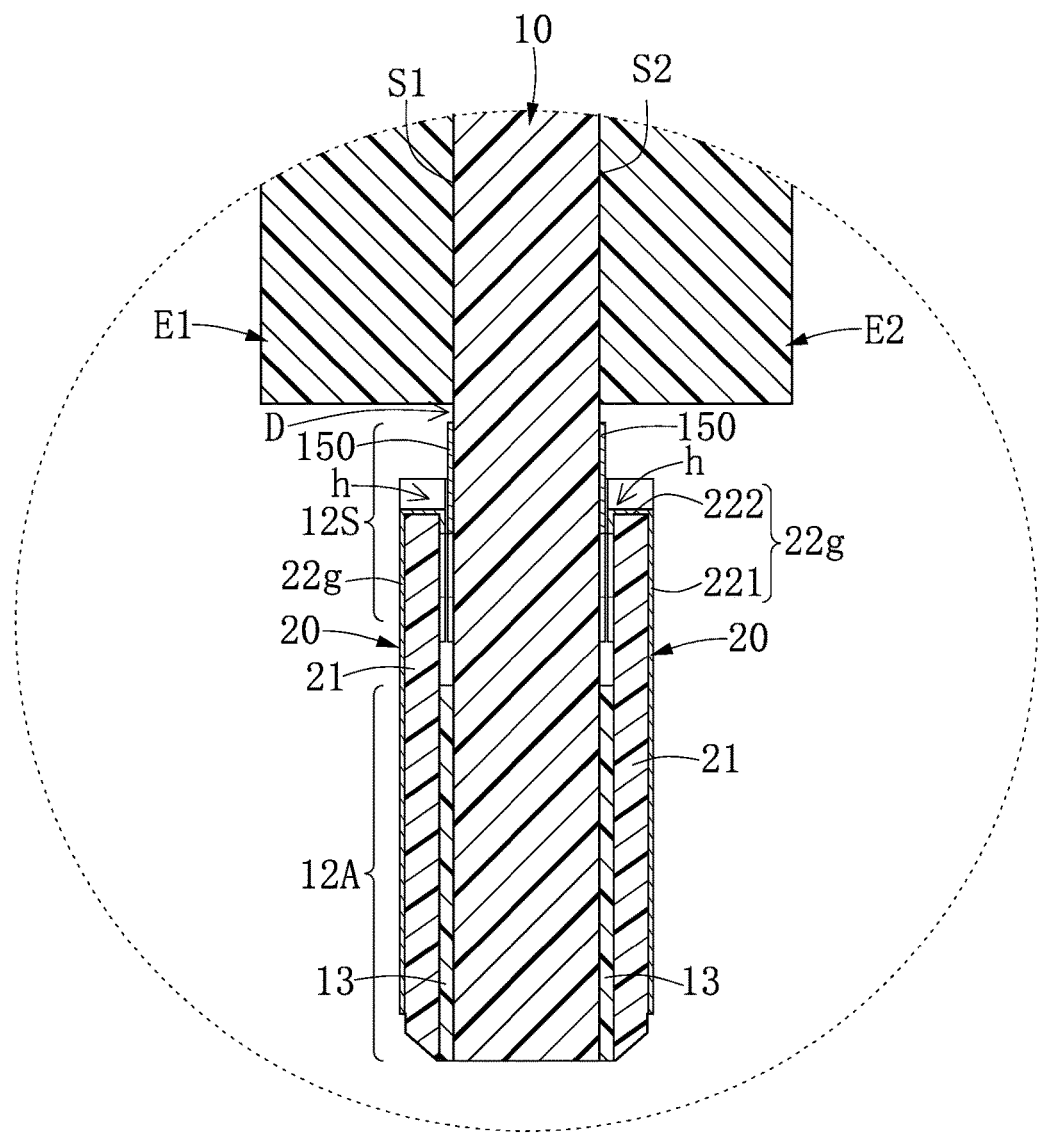
FIG. 6 is a partially-enlarged cross-sectional view of the memory module card structure of the present disclosure.

Referring to FIG. 5, which is a cross-sectional view of the memory module card structure along the V-V line in FIG. 4 of this embodiment. FIG. 6 is a partially-enlarged view of a VI-part of FIG. 5. The main board 10 further has a spacing region D formed between the mounting section 11 and the solder pad 150. In other words, the solder pad 150 is not extended directly to the mounting section 11 of the main board 10.

Referring to FIG. 6, which is a partially-enlarged cross-sectional view of the memory module card structure of this embodiment. A thickness of the main board 10 is 0.8 mm. A thickness of the rigid substrate 21 is 0.15 mm to 0.30 mm, and preferably is 0.20 mm. A thickness of the adhesive layer 13 is not larger than 0.15 mm, in other words, which is equal to or smaller than 0.15 mm.

Figure 6A:
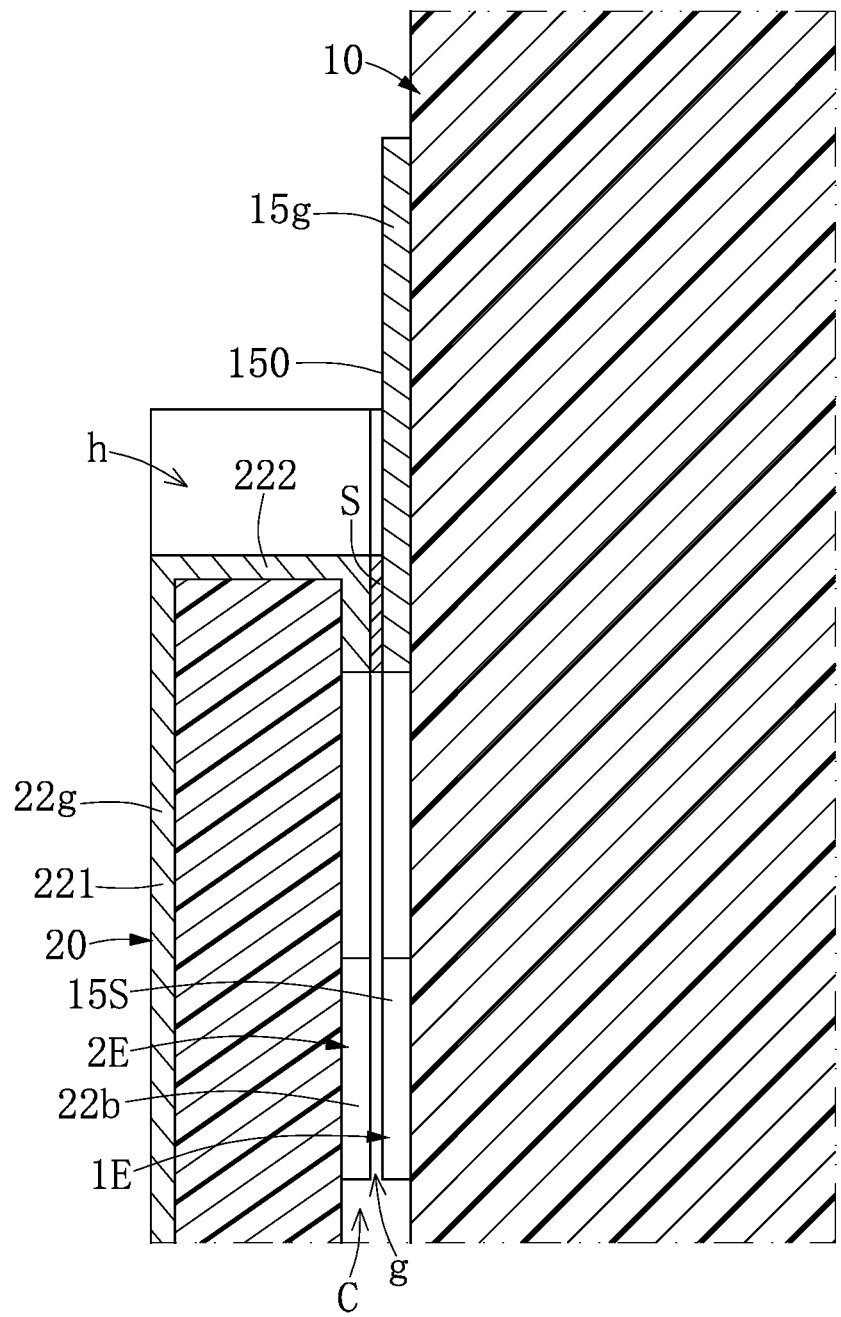
FIG. 6A is a partially-enlarged cross-sectional view of the memory module card structure of FIG. 6 of the present disclosure.

Reference is made to FIG. 6A. According to the memory module card structure of this embodiment, a part of the rigid substrate 21 without the conductive pad 22 is fixed to the binding region 12A of the inserting section 12 by the adhesive layer 13. The first extending part 1E which is extended from the solder pad 150 of the main board 10, and the second extending part 2E which is extended from the adapting part 222 of the conductive pad 22 along the inner surface of the rigid substrate 21, are not contacted to each other. A part of the second extending part 2E is overlapped above a part of the first extending part 1E, so that a gap C is formed therebetween to form a bypass capacitor. The bypass capacitor can filter out high-frequency noise in inputting signals, and specifically filter out the preloaded high-frequency noise. Therefore, the present disclosure provides functions of anti-interference or noise-reduction. To ensure that the overlapped region of the second extending part 2E and the first extending part 1E can be separated, this embodiment can provide an insulated layer on a surface of the first extending part 1E or on a surface of the second extending part 2E, or on both. For example, the insulated layer can be electric varnish.

In conclusion, the characteristics and effectiveness of the instant disclosure are that, the gold fingers of the present disclosure which are electrically connected to the memory modular cards are not directly formed on the main board. By the conduction skirting board 20 having the conductive pad 22, the thickness of the main board 10 can be reduced. In other words, the memory module card structure of the present disclosure can reduce the total thickness. Therefore, adjacent two of the memory module card structures are able to provide a larger gap for dissipating redundant heat, which benefits the high-frequency signals transmission.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An memory module card structure, comprising:
a main board having a first surface and a second surface opposite to the first surface, the main board being divided into a mounting section and an inserting section along an inserting direction, the inserting sections of the first surface and the second surface respectively having a binding region and a soldering region, the soldering region having a plurality of solder pads, the solder pads being electrically connected the mounting section;
at least one adhesive layer being disposed on the binding region of the inserting section; and
at least one conduction skirting board being correspondingly fixed to the inserting section, each of the at least one conduction skirting board having a rigid substrate and a plurality of conductive pads, each of the conductive pads having an outer contacting part and an adapting part; the
outer contacting part being located on an outer surface of the rigid substrate, the adapting part passing through the outer surface and an inner surface of the rigid substrate, and connecting the outer contacting part;
wherein a part of the conductive pads correspondingly electrically connects the solder pads, and a part of the rigid substrate is fixedly connected to the binding region of the inserting section by the adhesive layer.

2. The memory module card structure according to claim 1, wherein the mounting section is configured to receive a plurality of electronic elements thereon, and the solder pads are electrically connected to the electronic elements on the mounting section.

3. The memory module card structure according to claim 1, wherein the rigid substrate is formed with a plurality of through holes passing through the outer surface and the inner surface of the rigid substrate, the adapting part is formed in the through hole.

4. The memory module card structure according to claim 1, wherein the main board further includes a spacing region disposed between the mounting section and the solder pad.

5. The memory module card structure according to claim 1, wherein at least one of the pad structures has a first extending part, the first extending part extends from the solder pad; wherein at least one of the conductive pads has a second extending part, a part of the first extending part overlaps a part of the second extending part and forms a gap therebetween.

6. The memory module card structure according to claim 5, wherein the second extending part of the conductive pad is extended across another adjacent one of the conductive pads, and adjacent to but not contact another one of the conductive pads having the second extending part.

7. The memory module card structure according to claim 5, wherein the first extending part or the second extending part has an insulated layer.

8. The memory module card structure according to claim 1, wherein a thickness of the main board is 0.8 mm.

9. The memory module card structure according to claim 1, wherein a thickness of the rigid substrate is between 0.15 mm to 0.3 mm.

10. The memory module card structure according to claim 1, wherein a thickness of the adhesive layer is not larger than 0.15 mm.

* * * * *